(12) United States Patent
Sakai et al.

(10) Patent No.: US 7,886,432 B2
(45) Date of Patent: Feb. 15, 2011

(54) ELECTRIC COMPONENTS CONNECTING METHOD

(75) Inventors: Tadahiko Sakai, Fukuoka (JP); Hideki Eifuku, Fukuoka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/159,832

(22) PCT Filed: Sep. 13, 2007

(86) PCT No.: PCT/JP2007/068321
§ 371 (c)(1),
(2), (4) Date: Jul. 1, 2008

(87) PCT Pub. No.: WO2008/032867
PCT Pub. Date: Mar. 20, 2008

(65) Prior Publication Data
US 2009/0229123 A1 Sep. 17, 2009

(30) Foreign Application Priority Data
Sep. 15, 2006 (JP) .............................. 2006-251069

(51) Int. Cl.
*H05K 3/34* (2006.01)
(52) U.S. Cl. .................. 29/840; 29/854; 156/275.5; 438/106
(58) Field of Classification Search .............. 29/840, 29/854; 156/275.5; 438/106
See application file for complete search history.

(56) References Cited
U.S. PATENT DOCUMENTS
5,830,389 A    11/1998   Capote et al.
5,837,119 A *  11/1998   Kang et al. .................. 205/74
6,262,408 B1 *  7/2001   Izumi et al. .............. 250/208.1
6,498,051 B1 * 12/2002   Watanabe .................... 438/106
7,084,008 B2 *  8/2006   Sakurai et al. .............. 438/112

(Continued)

FOREIGN PATENT DOCUMENTS
EP          1333079          11/1998

(Continued)

OTHER PUBLICATIONS
International Search Report for PCT/JP2007-068321, Feb. 18, 2008.

*Primary Examiner*—Derris H Banks
*Assistant Examiner*—Jeffrey Carley
(74) *Attorney, Agent, or Firm*—Pearne & Gordon LLP

(57) ABSTRACT

A method for connecting a first terminal array 6 provided in a connection portion 5 of a first electric component and a second terminal array 8 provided in a connection portion 7 of a second electric component to each other in such a manner that electric continuity is established between them has two steps, that is, a step of tentatively fixing the two connection portions 5 and 7 with each other whose terminal arrays 6 and 8 are positioned with respect to each other by soldering them with solder particles 3 using a paste-like anisotropic conductive adhesive 1 in which the solder particles 3 and conductive particles 4 are dispersed in a thermosetting resin 2, and a step of finally fixing the two connection portions 5 and 7 with each other with the thermosetting resin 2 that has been set thermally. This prevents positional deviation from occurring between the two terminal arrays 6 and 8 during a transport from a tentative fixing apparatus to a final fixing apparatus.

6 Claims, 3 Drawing Sheets

U.S. PATENT DOCUMENTS

| | | | |
|---|---|---|---|
| 2001/0018796 A1* | 9/2001 | Lee et al. | 29/830 |
| 2003/0068906 A1* | 4/2003 | Light et al. | 439/66 |

FOREIGN PATENT DOCUMENTS

| | | |
|---|---|---|
| JP | 08-249930 | 9/1996 |
| JP | 09-283896 | 10/1997 |
| JP | 11-186334 | 7/1999 |

\* cited by examiner

ELECTRIC COMPONENTS CONNECTING METHOD

TECHNICAL FIELD

The present invention relates to an electric components connecting method using a paste-like anisotropic conductive adhesive.

BACKGROUND ART

Methods, which use an anisotropic conductive adhesive to connect electric components each having, in a connection portion, a terminal array that reflects a recent trend that the number of pins is increasing and their pitch is decreasing, have been put into practical use. The anisotropic conductive adhesive is configured in such a manner that conductive particles such as metal particles made of silver or a solder or particles produced by plating plastic resin particles with gold are dispersed in an insulative, thermosetting resin adhesive such as an epoxy resin. Pressure and heat are applied in a state that the anisotropic conductive adhesive is interposed between two connection portions that are positioned with respect to each other, whereby conductive particles are fusion-welded to confronting terminal arrays of the two connection portions and, at the same time, the resin is set thermally. In this manner, the confronting terminal arrays can be connected to each other electrically and the two connection portions can be connected to each other physically (refer to Patent document 1). In many cases, an electric components connecting process is divided into two processes, that is, a tentative fixing process and a final fixing process. The throughput is increased by executing the two processes in parallel (i.e., simultaneously) using an assembling line in which a tentative pressure bonding apparatus for tentative fixing and a final pressure bonding apparatus for final fixing are linked to each other (refer to Patent document 2). The tentative pressure bonding apparatus positions terminal arrays with respect to each other that are provided in pair in two respective connection portions, and performs tentative fixing. The final pressure bonding apparatus performs final fixing in which pressure and heat are applied to the tentatively fixed connection portions and a resin adhesive is thereby set completely.

When transported from the tentative pressure bonding apparatus to the final pressure bonding apparatus, the tentatively fixed electric components may receive external force such as vibration force. Therefore, a certain measure should be taken to prevent positional deviation from occurring between the two terminal arrays that are positioned with respect to each other. To this end, a tape-shaped ACF (anisotropic conductive film) is used widely as an anisotropic conductive adhesive. The ACF has an advantage that the positional relationship between two terminal arrays that are positioned with respect to each other is less prone to change, because its surface is tacky and high bonding strength can be produced by relatively low pressure. The bonding strength may be increased by forming an adhesive layer on the surface of the ACF (refer to Patent document 3).

[Patent document 1] JP-A-11-186334
[Patent document 2] JP-A-9-283896
[Patent document 3] JP-A-8-249930

DISCLOSURE OF THE INVENTION

However, whereas the ACF gives higher bonding strength than ACP (anisotropic conductive paste) which is a paste-like anisotropic conductive adhesive, the ACF, which is shaped into a tape form, is higher in cost than the ACP which is relatively inexpensive. The ACF is also inferior to the ACP in terms of easiness of work: dedicated apparatus for working the ACF into a shape that conforms to the connection portions of electric components to which the ACF is to be stuck and for sticking the ACF to the connection portions need to be installed, which require costs and installation spaces.

Although the ACP is superior to the ACF in the above points, it cannot provide sufficient bonding strength for tentative fixing of connection portions, which makes it necessary to complete a connection process (to final fixing) by a single pressure bonding operation. As such, the connecting method using the ACP is lower in throughput than that using the ACF in which a tentative fixing process and a final fixing process are executed in parallel (i.e., simultaneously).

An object of the present invention is therefore to provide an electric components connecting method capable of connecting electric components at a high throughput even in the case of using ACP.

According to the invention, an electric components connecting method for connecting a first terminal array provided in a connection portion of a first electric component and a second terminal array provided in a connection portion of a second electric component to each other in such a manner that electric continuity is established between them with a paste-like anisotropic conductive adhesive in which solder particles are dispersed in a thermosetting resin, the method comprises: a positioning step of causing the first terminal array and the second terminal array to be opposed to each other in a state that the anisotropic conductive adhesive is interposed between the connection portion of the first electric component and the connection portion of the second electric component; a soldering step of tentatively fixing the connection portion of the first electric component and the connection portion of the second electric component to each other by soldering the first terminal array and the second terminal array to each other by melting the solder particles contained in the anisotropic conductive adhesive; a step of transporting the first electric component and the second electric component that are fixed to each other tentatively; and a connecting step of finally fixing the connection portion of the first electric component and the connection portion of the second electric component to each other by setting the anisotropic conductive adhesive thermally.

Additionally, the soldering step comprises the substeps of applying pressure to the first terminal array from the side of the second terminal array and heating the solder particles from the side of the second terminal array, and finishing the pressure application and the heating simultaneously.

Additionally, soldering step comprises the substeps of applying pressure to the first terminal array from the side of the second terminal array and heating the solder particles from the side of the second terminal array, finishing the heating, and finishing the pressure application after the finish of the heating.

Furthermore, the soldering step comprises the substeps of applying pressure to the first terminal array from the side of the second terminal array and heating the solder particles from the side of the second terminal array, and dissipating, from the side of the first terminal array, heat that has been supplied to the solder particles.

Furthermore, the connecting step comprises the substep of heating the anisotropic conductive adhesive from the side of the connection portion of the second electric component.

Moreover, the connecting step comprises the substeps of applying pressure to the connection portion of the first electric component from the side of the connection portion of the second electric component, and heating the anisotropic conductive adhesive from the side of the connection portion of the second electric component.

The invention employs the two steps, that is, the step of tentatively fixing two connection portions to each other with molten solder particles to prevent positional deviation between two terminal arrays using a paste-like anisotropic conductive adhesive in which solder particles are dispersed in a thermosetting resin, and the step of finally fixing the two connection portions to each other with the thermosetting resin that has been set thermally. The two connection portions can be connected to each other at a high throughput although the paste-like anisotropic conductive adhesive is used which is low in bonding strength.

BEST MODE FOR CARRYING OUT THE INVENTION

An embodiment of the present invention will be hereinafter described with reference to the drawings.

Figure 1:
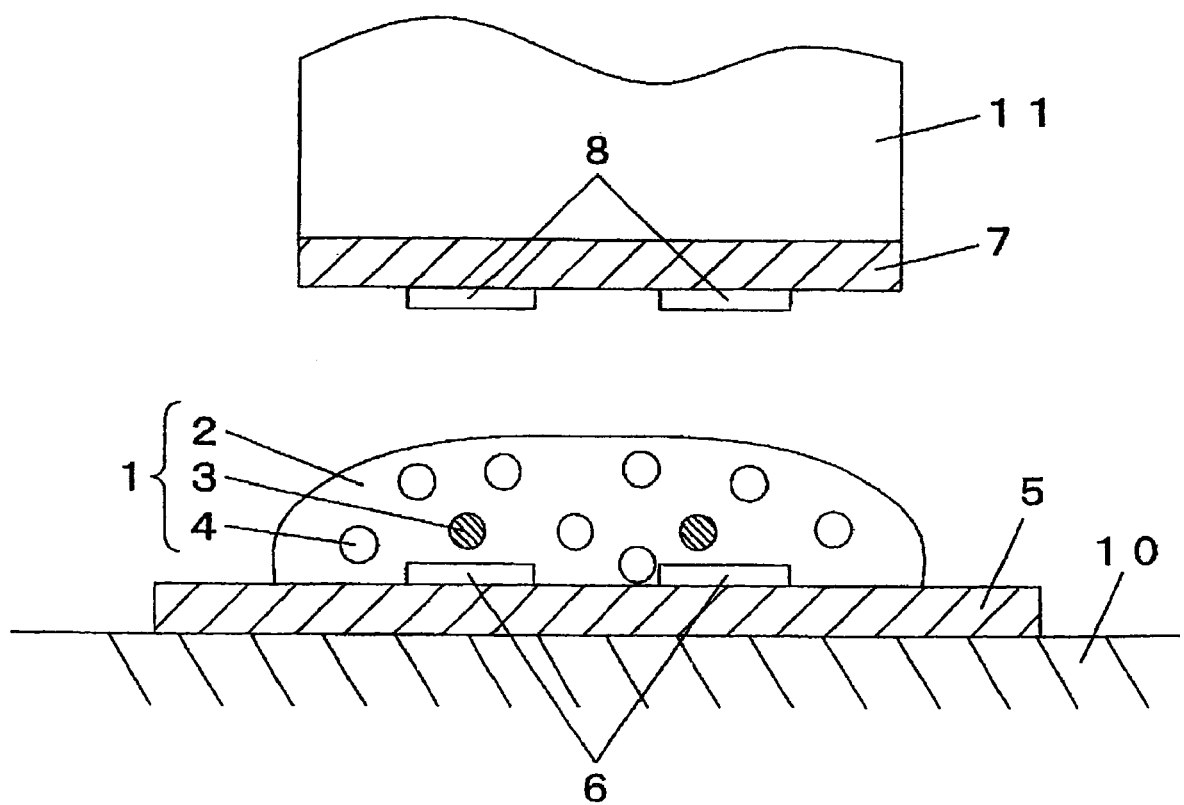
FIG. 1 is a sectional view showing the composition of an anisotropic conductive adhesive according to an embodiment of the present invention.

First, the composition of the anisotropic conductive adhesive according to the embodiment of the invention will be described with reference to FIG. 1. The anisotropic conductive adhesive 1 is configured in such a manner that solder particles 3 and conductive particles 4 are dispersed in a thermosetting resin 2. The thermosetting resin 2 is a paste-like, insulative, thermosetting resin adhesive such as an epoxy resin. The solder particles 3 are made of a low-melting-point metal that contains SnBi (melting point: about 140° C.) at 90% or more (weight percentage) and melts at a lower temperature than the thermosetting resin 2 starts to set thermally. The average diameter of the solder particles 3 is set at 5 to 15 μm. The conductive particles 4 are metal particles made of a noble metal such as silver or gold or particles produced by plating plastic resin particles with gold. The diameter of the conductive particles 4 is set smaller than that of the solder particles 3. The conductive particles 4 are not indispensable, that is, they may be omitted.

Next, an electric components connecting method according to the embodiment of the invention will be described with reference to FIGS. 1-3. As shown in FIG. 1, a first terminal array 6 which is an arrangement of plural electrode pads is formed in a connection portion 5 of a first electric component. A second terminal array 8, which is similar to the first terminal array 6, is formed in a connection portion 7 of a second electric component which is to be connected to the first electric component. The anisotropic conductive adhesive 1 has been applied to the connection portion 5 of the first electric component with a dispenser or the like. The first terminal array 6 and the second terminal array 8 are opposed to each other in a state that the anisotropic conductive adhesive 1 is interposed between the connection portion 5 of the first electric component and the connection portion 7 of the second electric component (positioning step).

Figure 2:
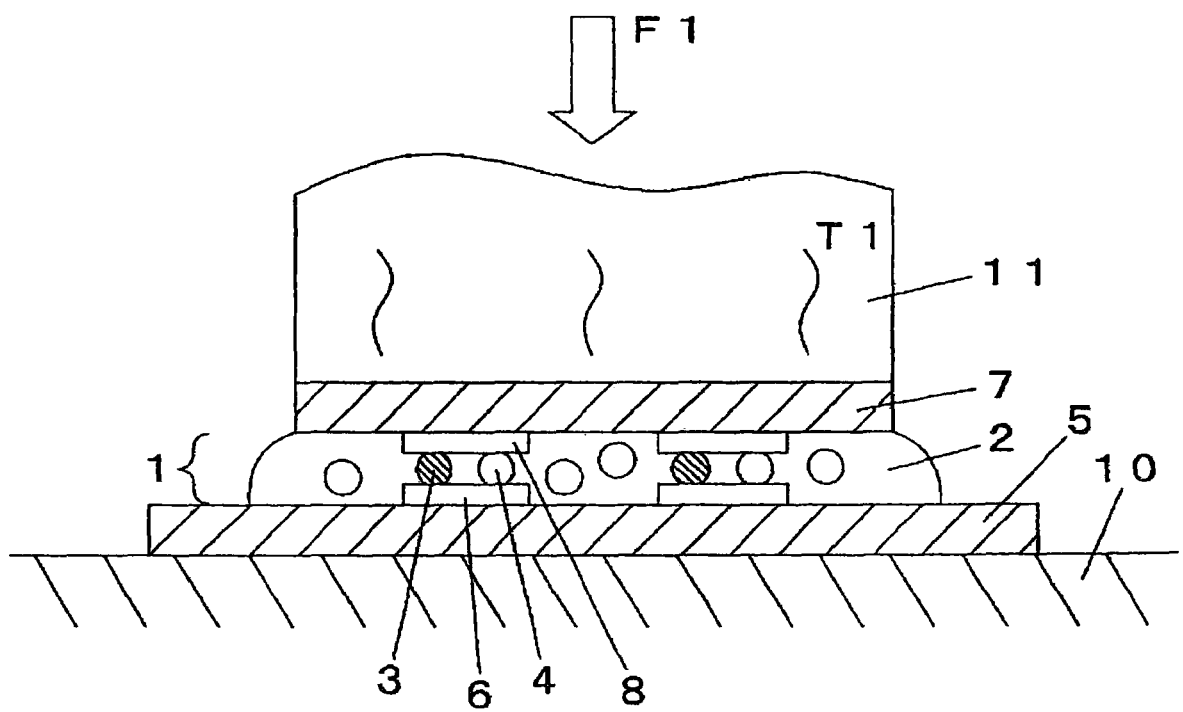
FIG. 2 is a sectional view showing connection portions of first and second electric components that are fixed to each other tentatively with the anisotropic conductive adhesive according to the embodiment of the invention.

Then, as shown in FIG. 2, solder particles 3 contained in those portions of the anisotropic conductive adhesive 1 which are interposed between the first terminal array 6 and the second terminal array 8 are melted, whereby the first terminal array 6 and the second terminal array 8 are soldered to each other (soldering step). The solder particles 3 are brought into contact with the first terminal array 6 and the second terminal array 8 in a state that are melted by heat that is supplied externally. The solder particles 3 are then solidified, whereby the first terminal array 6 and the second terminal array 8 are soldered to each other. The soldering step is intended to tentatively fix the connection portion 5 of the first electric component and the connection portion 7 of the second electric component to each other by soldering the first terminal array 6 and the second terminal array 8 to each other. Since it is not intended to thermally set the thermosetting resin 2, the heating temperature T1 (i.e., the temperature of a thermal compression bonding tool) is set higher than the melting point T of the solder particles (preferably by 10° or more) and the pressure bonding time (heating time) is set longer than a minimum time (0.5 to 3 seconds) that is necessary for melting of the solder particles 3.

A positioning and soldering apparatus may be a tentative pressure bonding apparatus having a thermal compression bonding tool 11 which can be moved relative to a stage 10. After the second terminal array 8 which is absorbed on the thermal compression bonding tool 11 is positioned with respect to the first terminal array 6 which is fixed to the stage 10, heating is performed at the heating temperature T1 from the side of the second terminal array 8 and the connection portion 7 of the second electric component is pressed against the connection portion 5 of the first electric component at a force F1, whereby the solder particles 3 between the first terminal array 6 and the second terminal array 8 are melted while being crushed. To solidify the molten solder particles 3, it is necessary to cool them to a temperature that is lower than the melting point T. Therefore, after the heating and the pressure application of the prescribed time, the thermal compression bonding tool 11 is separated from the connection portion 7 of the second electric component. As a result, the heating and the pressure application are finished simultaneously and the solder particles 3 are cooled naturally to a temperature that is lower than the melting point T. At this time, better soldering can be realized by finishing the heating before a finish of the pressure application, because the solder particles 3 are solidified in a state that they are crushed between the first terminal array 6 and the second terminal array 8.

The stage 10 to which the first terminal array 6 is fixed may be made of a material having high thermal conductivity such as stainless steel or aluminum, which enables soldering that utilizes a phenomenon that heat that is supplied from the side of the second terminal array 8 serves to heat the solder particles 3 and then is dissipated to the side of the stage 10 via the first terminal array 6, resulting in cooling of the solder particles 3. More specifically, pressure is applied from the side of the second terminal array 8 by means of the thermal compression bonding tool 11 which is heated to the heating temperature T1 which is higher than the melting point T (T+10° C. to T+30° C.). The solder particles 3 are melted being heated to a temperature that is higher than the melting point T. The solder particles 3 are then solidified temporarily being cooled to a temperature that is lower than the melting point T because of the above-mentioned heat dissipation. The soldering step is completed by elevating the thermal compression bonding tool 11 with timing that the solder particles 3 have been solidified.

Figure 3:
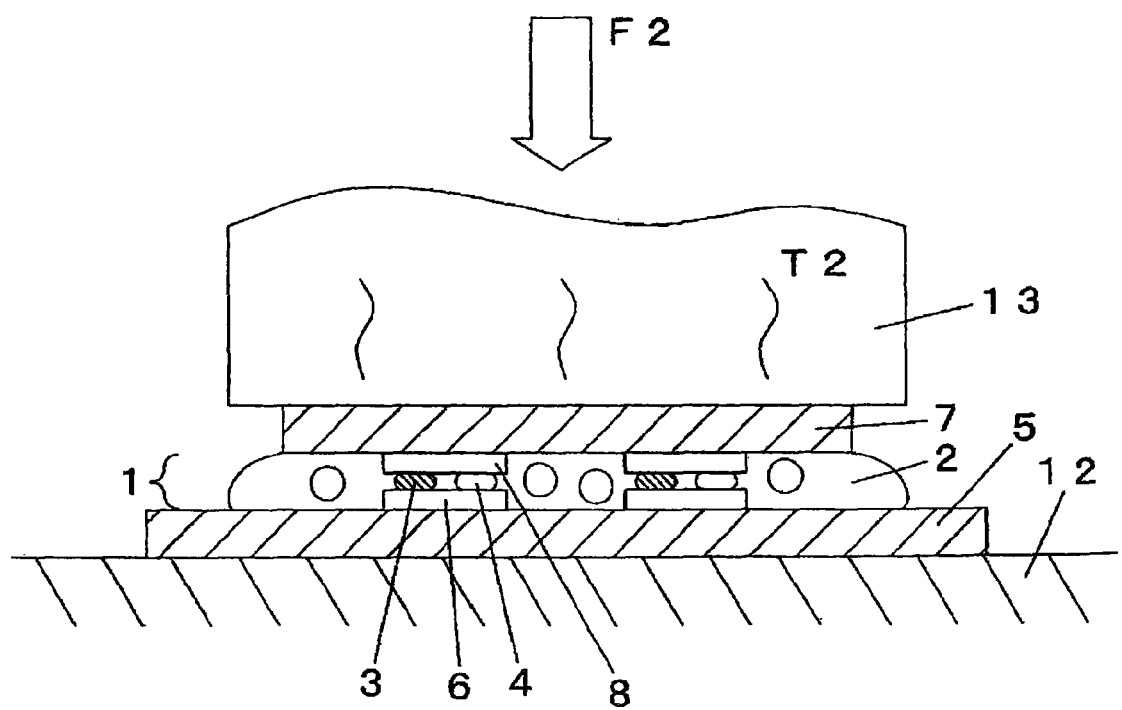
FIG. 3 is a sectional view showing the connection portions of the first and second electric components that are fixed to each other finally with the anisotropic conductive adhesive according to the embodiment of the invention.

Subsequently, as shown in FIG. 3, the anisotropic conductive adhesive 1 which is interposed between the connection portion 5 of the first electric component and the connection portion 7 of the second electric component is set thermally, whereby the connection portion 5 of the first electric component and the connection portion 7 of the second electric component are connected to each other (connecting step). The thermosetting resin 2 which is the base of the anisotropic conductive adhesive 1 is set by externally supplied heat and thereby fixes the connection portion 5 of the first electric component and the connection portion 7 of the second electric component finally in an irreversible manner. To this end, the heating temperature in the connecting step is set at a temperature T2 which is higher than the thermal setting temperature of the thermosetting resin 2 and the heating time is set longer than a time (4 seconds or more) that is necessary for thermal setting of the thermosetting resin 2.

A connecting apparatus may be a thermal compression bonding apparatus having a thermal compression bonding tool 13 which can be moved relative to a stage 12. The connection portion 5 of the first electric component and the connection portion 7 of the second electric component that have been fixed to each other tentatively and transported onto the stage 12 are heated at the temperature T2 from the side of the connection portion 7 of the second electric component, whereby the anisotropic conductive adhesive 1 which is interposed between the connection portion 5 of the first electric component and the connection portion 7 of the second electric component is set thermally. At this time, the connection portion 7 of the second electric portion is pressed against the connection portion 5 of the first electric component by a force F2, whereby the solder particles 3 and the conductive particles 4 between the first terminal array 6 and the second terminal array 4 are crushed and their contact areas with the terminal arrays 4 and 6 are increased. Better electric continuity can thereby be attained.

As described above, in the electric components connecting method according to the embodiment, two electric components are connected to each other by the two steps, that is, the step of tentatively fixing two connection portions 5 and 7 by molten solder particles 3 using a paste-like anisotropic conductive adhesive 1 in which solder particles 3 are dispersed in a thermosetting resin 2 and the step of fixing the two connection portions 5 and 7 finally by the thermosetting resin 2 that has been set thermally. The bonding strength of the two connection portions 5 and 7 that are fixed to each other tentatively by the molten solder particles 3 is lower than that obtained when the thermosetting resin 2 is set thermally. However, the two connection portions 5 and 7 are fixed to each other tentatively with sufficient bonding strength to prevent positional deviation from occurring between the first terminal array 6 and the second terminal array 8 by vibration or impact that is exerted during a transport to the final pressure bonding apparatus. This enables final fixing in a state that high positional accuracy is maintained and thereby enables high-throughput production.

INDUSTRIAL APPLICABILITY

The invention provides an advantage that a high-throughput connecting process can be realized even with a paste-like anisotropic conductive adhesive which is low in bonding strength. As such, the invention is useful when applied to a process of connecting electric components for mass-production electronic equipment.

This application is based upon and claims the benefit of priority of Japanese Patent Application No. 2006-251069 filed on Sep. 15, 2006, the contents of which are incorporated herein by reference in its entirety.

The invention claimed is:

1. An electric components connecting method for connecting a first terminal array provided in a connection portion of a first electric component and a second terminal array provided in a connection portion of a second electric component to each other in such a manner that electric continuity is established between them with a paste-like anisotropic conductive adhesive in which solder particles are dispersed in a thermosetting resin, comprising:

a positioning step of causing the first terminal array and the second terminal array to be opposed to each other in a state that the anisotropic conductive adhesive is interposed between the connection portion of the first electric component and the connection portion of the second electric component;

a soldering step of tentatively fixing the connection portion of the first electric component and the connection portion of the second electric component to each other by soldering the first terminal array and the second terminal array to each other by melting the solder particles contained in the anisotropic conductive adhesive by a first thermal compression bonding tool (11) of a tentative pressure bonding apparatus;

a step of transporting the first electric component and the second electric component that are fixed to each other tentatively; and a connecting step of finally fixing the connection portion of the first electric component and the connection portion of the second electric component to each other by setting the anisotropic conductive adhesive thermally by a second thermal compression bonding tool (13) of a thermal compression bonding apparatus.

2. An electric components connecting method for connecting a first terminal array provided in a connection portion of a first electric component and a second terminal array provided in a connection portion of a second electric component to each other in such a manner that electric continuity is established between them with a paste-like anisotropic conductive adhesive in which solder particles are dispersed in a thermosetting resin, comprising:

a positioning step of causing the first terminal array and the second terminal array to be opposed to each other in a state that the anisotropic conductive adhesive is interposed between the connection portion of the first electric component and the connection portion of the second electric component;

a soldering step of tentatively fixing the connection portion of the first electric component and the connection portion of the second electric component to each other by soldering the first terminal array and the second terminal array to each other by melting the solder particles contained in the anisotropic conductive adhesive;

a step of transporting the first electric component and the second electric component that are fixed to each other tentatively; and a connecting step of finally fixing the connection portion of the first electric component and the connection portion of the second electric component to each other by setting the anisotropic conductive adhesive thermally, wherein the soldering step comprises the substeps of applying pressure to the first terminal array from the side of the second terminal array and heating the solder particles from the side of the second terminal array, and finishing the pressure application and the heating simultaneously.

3. An electric components connecting method for connecting a first terminal array provided in a connection portion of a first electric component and a second terminal array provided in a connection portion of a second electric component to each other in such a manner that electric continuity is established between them with a paste-like anisotropic conductive adhesive in which solder particles are dispersed in a thermosetting resin, comprising:

a positioning step of causing the first terminal array and the second terminal array to be opposed to each other in a state that the anisotropic conductive adhesive is interposed between the connection portion of the first electric component and the connection portion of the second electric component;

a soldering step of tentatively fixing the connection portion of the first electric component and the connection portion of the second electric component to each other by soldering the first terminal array and the second terminal array to each other by melting the solder particles contained in the anisotropic conductive adhesive;

a step of transporting the first electric component and the second electric component that are fixed to each other tentatively; and a connecting step of finally fixing the connection portion of the first electric component and the connection portion of the second electric component to each other by setting the anisotropic conductive adhesive thermally, wherein the soldering step comprises the substeps of applying pressure to the first terminal array from the side of the second terminal array and heating the solder particles from the side of the second terminal array, finishing the heating, and finishing the pressure application after the finish of the heating.

4. The electric components connecting method according to any one of claims 1 to 3, wherein the soldering step comprises the substeps of applying pressure to the first terminal array from the side of the second terminal array and heating the solder particles from the side of the second terminal array, and dissipating, from the side of the first terminal array, heat that has been supplied to the solder particles.

5. The electric components connecting method according to any one of claims 1 to 3, wherein the connecting step comprises the substep of heating the anisotropic conductive adhesive from the side of the connection portion of the second electric component.

6. The electric components connecting method according to any one of claims 1 to 3, wherein the connecting step comprises the substeps of applying pressure to the connection portion of the first electric component from the side of the connection portion of the second electric component, and heating the anisotropic conductive adhesive from the side of the connection portion of the second electric component.

* * * * *